United States Patent
Nishizuka et al.

(10) Patent No.: US 8,765,589 B2
(45) Date of Patent: Jul. 1, 2014

(54) SEMICONDUCTOR DEVICE MANUFACTURING METHOD

(75) Inventors: Tetsuya Nishizuka, Amagasaki (JP); Masahiko Takahashi, Amagasaki (JP)

(73) Assignee: Tokyo Electron Limited (JP)

( * ) Notice: Subject to any disclaimer, the term of this patent is extended or adjusted under 35 U.S.C. 154(b) by 365 days.

(21) Appl. No.: 12/673,923

(22) PCT Filed: Aug. 26, 2008

(86) PCT No.: PCT/JP2008/065151
§ 371 (c)(1),
(2), (4) Date: Feb. 17, 2010

(87) PCT Pub. No.: WO2009/028480
PCT Pub. Date: Mar. 5, 2009

(65) Prior Publication Data
US 2011/0039407 A1    Feb. 17, 2011

(30) Foreign Application Priority Data
Aug. 31, 2007    (JP) ................................ 2007-226345

(51) Int. Cl.
*H01L 21/3205* (2006.01)
*H01L 21/4763* (2006.01)

(52) U.S. Cl.
USPC ............................ 438/593; 438/587; 438/592

(58) Field of Classification Search
USPC .................................................. 438/689–757
See application file for complete search history.

(56) References Cited

U.S. PATENT DOCUMENTS

| | | | |
|---|---|---|---|
| 5,336,365 A * | 8/1994 | Goda et al. | 438/714 |
| 5,437,765 A * | 8/1995 | Loewenstein | 216/51 |
| 7,569,876 B2 * | 8/2009 | Forbes | 257/288 |
| 2001/0001722 A1 * | 5/2001 | Forbes et al. | 438/268 |
| 2001/0016423 A1 * | 8/2001 | Sakamoto | 438/709 |
| 2002/0052090 A1 * | 5/2002 | Jung et al. | 438/396 |
| 2004/0053484 A1 * | 3/2004 | Kumar et al. | 438/585 |
| 2004/0077178 A1 * | 4/2004 | Yang et al. | 438/710 |
| 2005/0026420 A1 * | 2/2005 | Han et al. | 438/622 |
| 2005/0085090 A1 * | 4/2005 | Mui et al. | 438/714 |
| 2005/0188922 A1 * | 9/2005 | Ishibashi et al. | 118/723 L |

FOREIGN PATENT DOCUMENTS

| | | |
|---|---|---|
| JP | 09-069511 | 3/1997 |
| JP | 2002-261043 | 9/2002 |
| JP | 2005-277397 | 10/2005 |
| KR | 10-2003-0065631 | 8/2003 |

OTHER PUBLICATIONS

International Search Report-PCT/JP2008/065151 dated Dec. 2, 2008.
Korean Office Action—Korean Application No. 10-2009-7026789 issued on Feb. 9, 2012, citing KR 10-2003-0065631 and JP 2002-261043.

* cited by examiner

*Primary Examiner* — Karen Kusumakar
(74) *Attorney, Agent, or Firm* — Cantor Colburn LLP

(57) ABSTRACT

A semiconductor device manufacturing method, the method including: forming an insulation layer having a protruding portion, the insulation layer having a surface and a rising surface that protrudes upward from the surface, on a semiconductor substrate; forming a conductive layer to cover the insulation layer having the protruding portion; and removing a predetermined region of the conductive layer by patterning the predetermined region according to an etching process using microwave plasma, which uses a microwave as a plasma source, while applying bias power of 70 mW/cm$^2$ or above on the semiconductor substrate, under a high pressure condition of 85 mTorr or above.

7 Claims, 14 Drawing Sheets

SEMICONDUCTOR DEVICE MANUFACTURING METHOD

TECHNICAL FIELD

The present invention relates to a semiconductor device manufacturing method, and more particularly, to a semiconductor device manufacturing method, the method including an operation of performing an etching process by using plasma.

BACKGROUND ART

Semiconductor devices, such as large scale integrated circuits (LSI), are manufactured by alternately stacking an insulation layer and a conductive layer on a semiconductor substrate. Generally, a layer formed on the semiconductor substrate through a chemical vapor deposition (CVD) process, or the like is patterned according to an etching process, thereby stacking layers on the semiconductor substrate. During is the etching process, plasma generated by various devices, such as a parallel plate plasma plasma source, an inductively-coupled plasma (ICP) plasma source, and an electron cyclotron resonance (ECR) plasma source is used.

Recently, in semiconductor devices including a semiconductor element, such as a metal oxide semiconductor (MOS) transistor, a 3-dimensional structure is required in terms of high integration. Here, a configuration of a MOS transistor having a 3-dimensional structure will be simply described.

FIGS. 12 and 13 are exterior perspective views of a semiconductor device 101 including a MOS transistor having a 3-dimensional structure. FIG. 12 shows a conductive layer 109, to be described later, before being etched, and FIG. 13 shows the conductive layer 109 after being etched. Referring to FIGS. 12 and 13, the semiconductor device 101 includes a plurality of protrusions 104 that are conductive and extend perpendicularly to a main surface 103 of a semiconductor substrate (wafer) 102. Each of the protrusions 104 extends in a direction indicated by an arrow XII of FIG. 12. A source region and a drain region are formed along a length direction of each protrusion 104, wherein the conductive layer 109 as shown in FIG. 13 is sandwiched therebetween.

An insulation layer 105 formed of $SiO_2$ film is formed on the semiconductor substrate 102. Also, a thin $SiO_2$ film 106 is formed as a gate oxide film on a channel region disposed between the source region and the drain region so as to cover the protrusion 104. Here, since the $SiO_2$ film 106 constituting a gate oxide film is formed to cover the protrusions 104, a high step XI in a layer-stacking direction exists between a top surface 107 of the protrusions 104, and a surface 108.

Next, the conductive layer 109 formed of polysilicon (polycrystalline silicon) is formed to cover the $SiO_2$ film 106. Then, the conductive layer 109 of polysilicon is patterned by using a resist 110 as a mask, and etched so as to remove a predetermined region of the conductive layer 109 as shown in FIG. 13. The remaining conductive layer 109 is a gate electrode. As such, the MOS transistor having a 3-dimensional structure is formed on the semiconductor substrate 102. Here, an etching residue 111 remains on sides of each protrusion 104.

Accordingly, when the etching process is performed on the conductive layer 109 of poly-silicon having the high step XI, the etching process may be performed in two operations having different processing conditions, as disclosed in Japanese Laid-Open Patent Publication No. hei 9-69511. Here, the etching process may be performed by a is plasma processing apparatus, such as the ICP plasma source, where HBr gas or $Cl_2$ gas with a very small amount of $O_2$ is generally used as an etching gas.

According to Japanese Laid-Open Patent Publication No. hei 9-69511, the etching process may be performed on the conductive layer 109 of poly-silicon in two operations including a main etching process and an over etching process. FIG. 14 is a graph showing a relationship between an etching area ratio and a etching selectivity during an etching process. In FIG. 14, the horizontal axis indicates the etching area ratio (%), and the vertical axis indicates the etching selectivity (poly-silicon/$SiO_2$).

Here, the etching area ratio is a ratio of an area $S_2$ of exposed poly-silicon to be etched with respect to the total sum of the area $S_2$ and an area $S_3$ of $SiO_2$ exposed from the bottom layer of the poly-silicon through an etching process. In other words, an etching area ratio in FIG. 12 is 100, since there exists only an area $S_1$ of exposed poly-silicon to be etched, and the area $S_3$ of the exposed $SiO_2$ is 0. Also, when all $SiO_2$ is exposed as the poly-silicon is etched out, the etching area ratio is 0. The etching selectivity is a ratio of an etching rate of poly-silicon when an etching rate of $SiO_2$ is 1.

Referring to FIG. 14, when $SiO_2$ is not exposed as in FIG. 12, the main etching process is performed in a low etching selectivity so as to obtain an accurate shape. As the main etching process is performed, the area $S_2$ of a portion to be etched decreases, and the exposed area $S_3$ of $SiO_2$ increases. As a result, the etching residue 111 remains on the sides of each protrusion 104 as shown in FIG. 13. Here, when the etching process is performed on the etching residue 111, a reaction product, such as SiBr, generated by the etching process is activated, and the reaction product deteriorates the etching selectivity. When the etching process is performed in a low etching selectivity, the thin $SiO_2$ film 106 having a large exposed area, specifically the top surface 107 of the thin $SiO_2$ film 106 which exists on the top surfaces of the protrusions 104, may be easily damaged. Accordingly, as shown in FIG. 14, during the over etching process, the etching process needs to be performed in a high etching selectivity, for example, in a etching selectivity of 50 or above.

When the etching process is performed in two steps as described above, the etching process needs to be performed in different conditions, and thus number of operations increases, thereby decreasing the efficiency of manufacturing a semiconductor device.

DISCLOSURE OF THE INVENTION

Technical Problem

To solve the above and/or other problems, the present invention provides a method of appropriately and efficiently manufacturing a semiconductor device.

Technical Solution

According to an aspect of the present invention, there is provided a semiconductor device manufacturing method, the method including: forming an insulation layer having a protruding portion, the insulation layer having a surface and a rising surface that protrudes upward from the surface, on a semiconductor substrate; forming a conductive layer to cover the insulation layer having the protruding portion; and removing a predetermined region of the conductive layer by patterning the predetermined region according to an etching process using microwave plasma, which uses a microwave as a plasma source, while applying bias power of 70 $mW/cm^2$ or above on the semiconductor substrate, under a high pressure condition of 85 mTorr or above.

According to the manufacturing method of the semiconductor device, the predetermined area of the conductive layer formed on the insulation layer, which has the protruding portion having the rising surface, is removed by patterning according to the etching process using microwave plasma, in which a microwave is used as a plasma source, while applying bias power of 70 mW/cm$^2$ or above to the semiconductor substrate under the high pressure condition of 85 mTorr or above. Accordingly, the activation of a reaction product generated during the etching process may be suppressed, and the etching process may be performed while maintaining a high etching selectivity. As such, the etching process may be performed while forming a shape accurately, i.e., while not generating an etching residue on the rising surface, and preventing damage to the insulation layer. Also, when the semiconductor device having the protruding portion is etched, the conductive layer may be removed by performing an etching process including only one operation. Accordingly, the semiconductor device may be manufactured appropriately and efficiently.

In a more preferable embodiment, a bias voltage of a frequency from 100 kHz to 2 MHz may be applied to the semiconductor substrate, while performing the etching process.

In a more preferable embodiment, a flow of an etching gas may be 1600 sccm or is above while performing the etching process.

In a more preferable embodiment, the insulation layer may be an oxidized silicon film, and the conductive layer may be a polysilicon layer.

In a more preferable embodiment, the method may further include: before the forming of the insulation layer, forming a conductive layer having a protruding portion that protrudes upward on the semiconductor substrate, wherein the insulation layer may include a thin insulation layer formed on a surface of the conductive layer having the protruding portion.

In a more preferable embodiment, the insulation layer having the protruding portion may be disposed on the top of the rising surface with a predetermined height from the surface.

According to another aspect of the present invention, there is provided a semiconductor device manufacturing method, the method including: forming a protrusion, which extends by protruding upward from a main surface of a semiconductor substrate and is to constitute a source region and a drain region; forming an insulation layer, which is to constitute a gate insulation film, on a channel region disposed between the source region and the drain region of the protrusion; forming a conductive layer covering the protrusion and the insulation layer; and forming a gate electrode by removing the conductive layer while leaving a portion of the conductive layer on the channel region, by patterning the conductive layer according to an etching process using microwave plasma, which uses a microwave as a plasma source, while applying bias power of 70 mW/cm$^2$ or above to the semiconductor substrate, under a high pressure condition of 85 mTorr or above.

BEST MODE FOR CARRYING OUT THE INVENTION

Hereinafter, the present invention will be described in detail by explaining exemplary embodiments of the invention with reference to the attached drawings.

Figure 1:
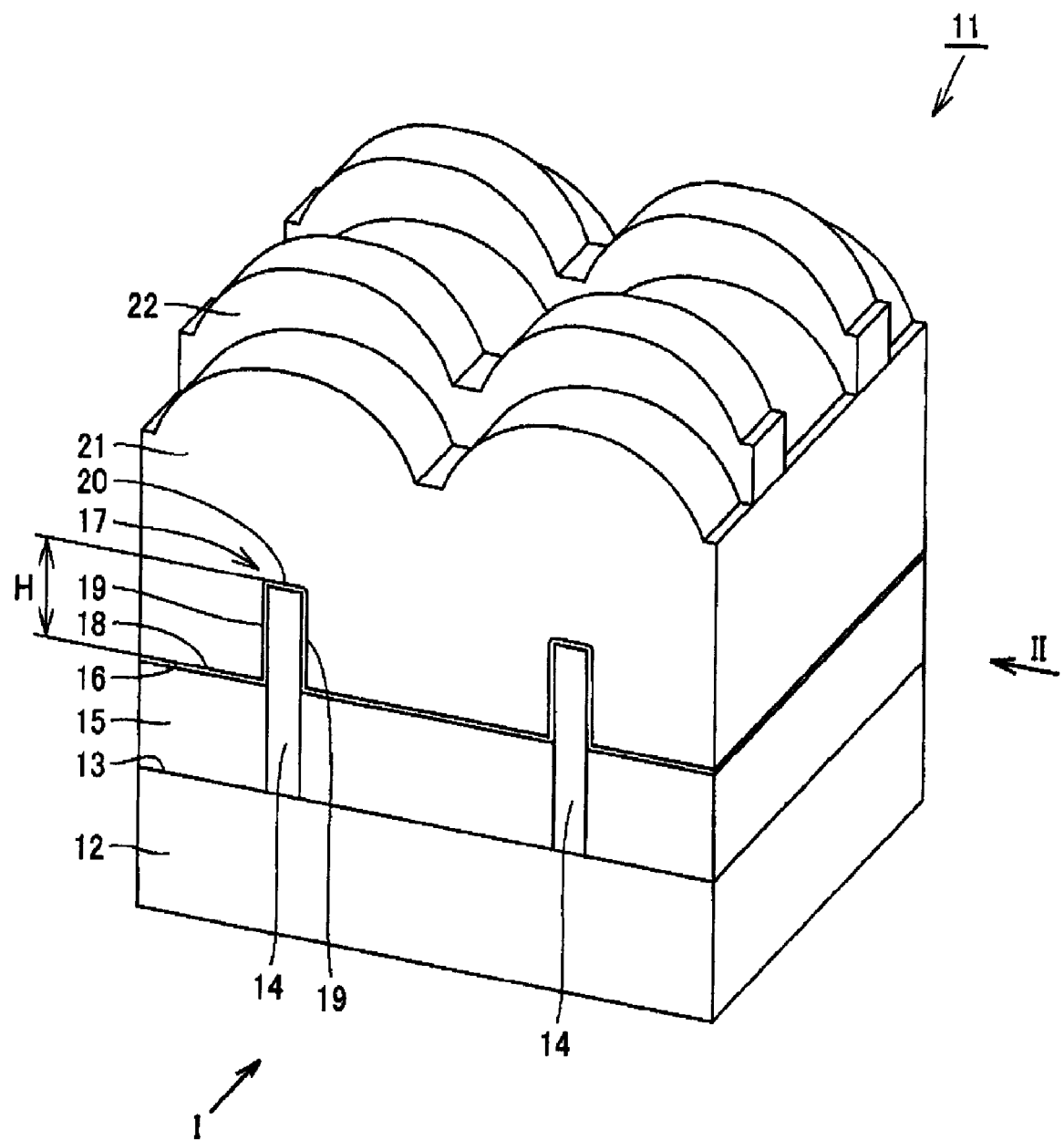
FIG. 1 is an exterior perspective view of a semiconductor device before an etching process is performed thereon, wherein the semiconductor device is manufactured according to a semiconductor device manufacturing method of the present invention.
Figure 2:
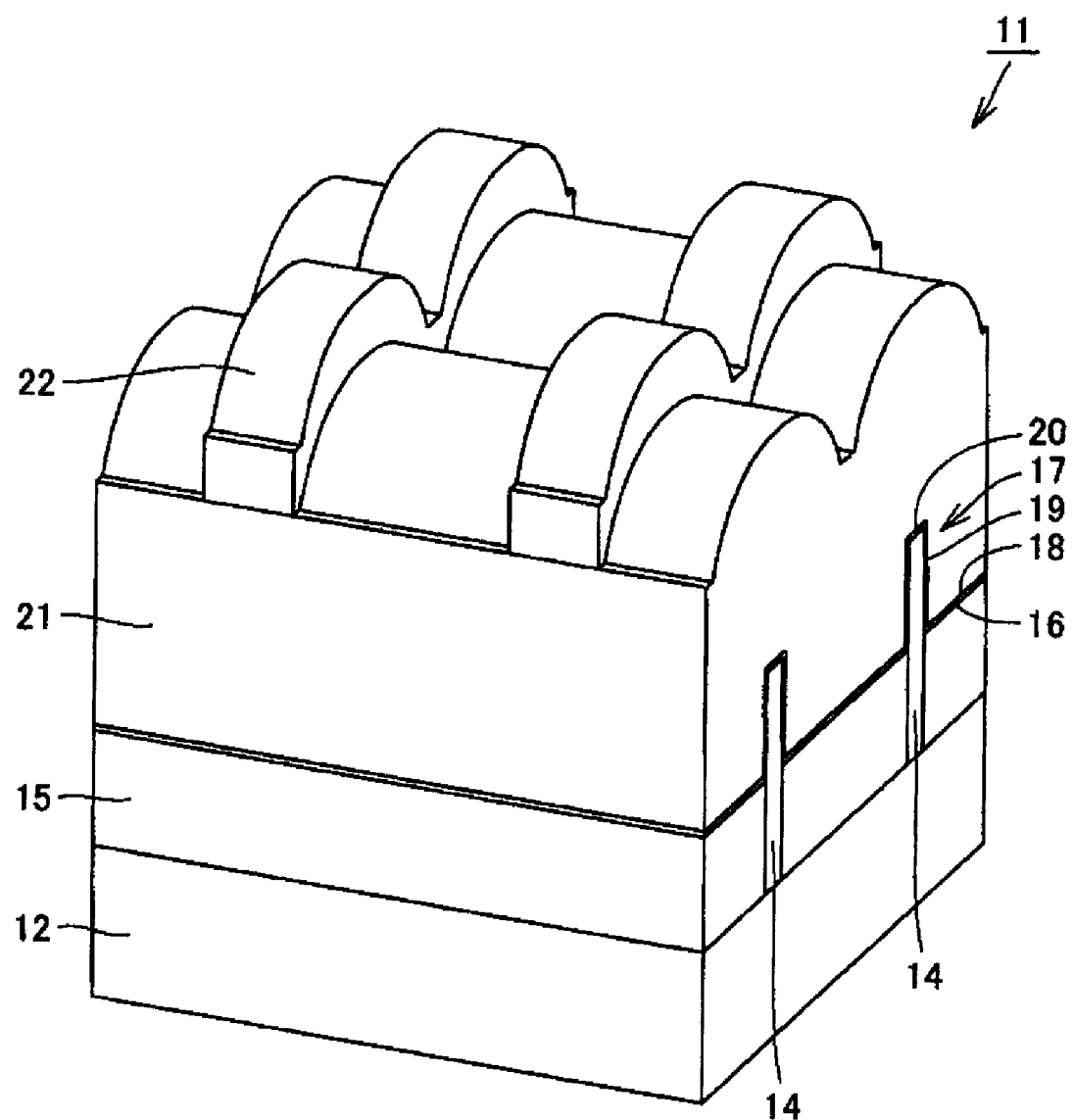
FIG. 2 is an exterior perspective view of the semiconductor device of FIG. 1, viewed from a direction of an arrow II of FIG. 1.
Figure 3:
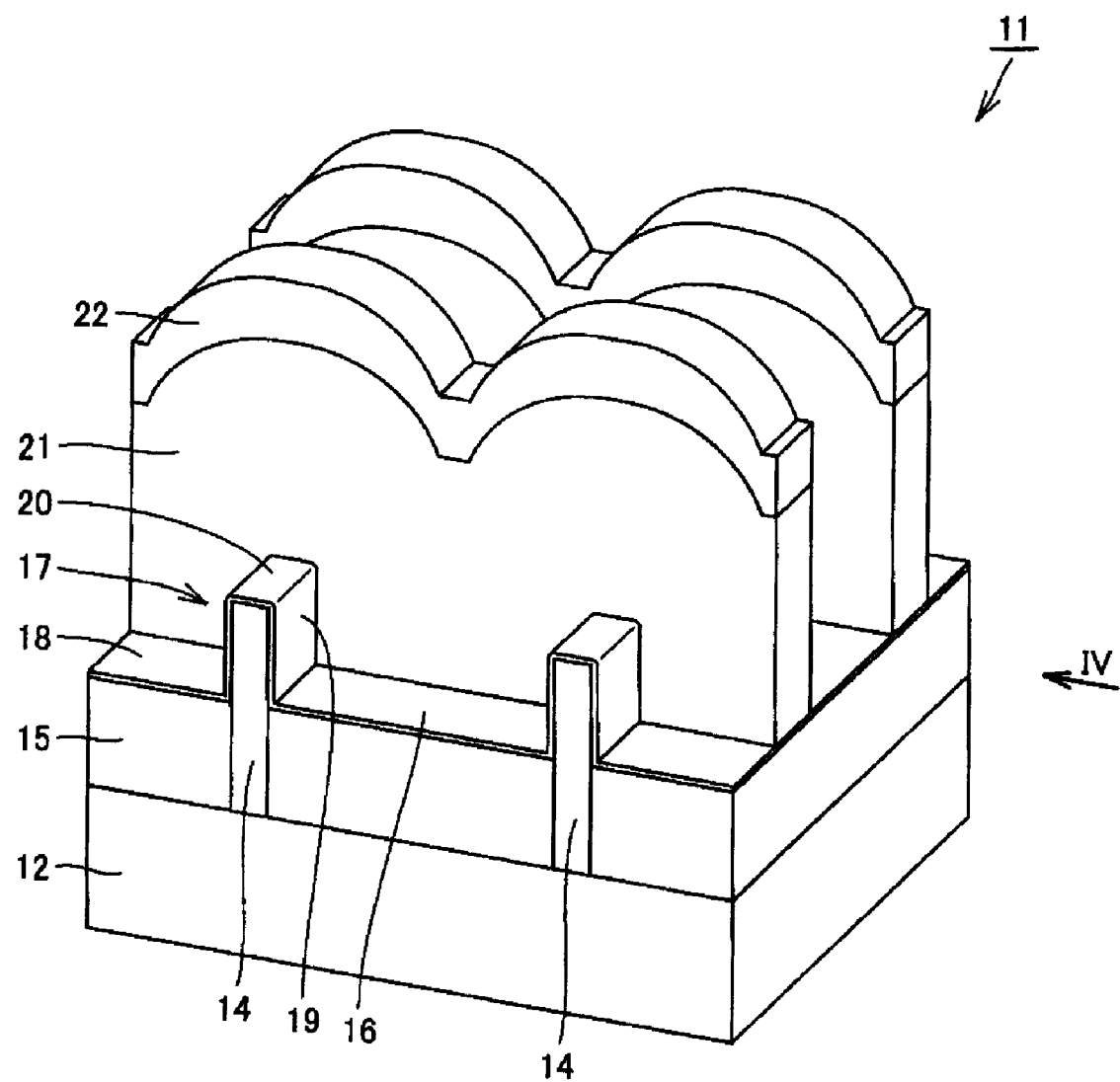
FIG. 3 is an exterior perspective view of the semiconductor device of FIG. 1, after an etching process is performed thereon.
Figure 4:
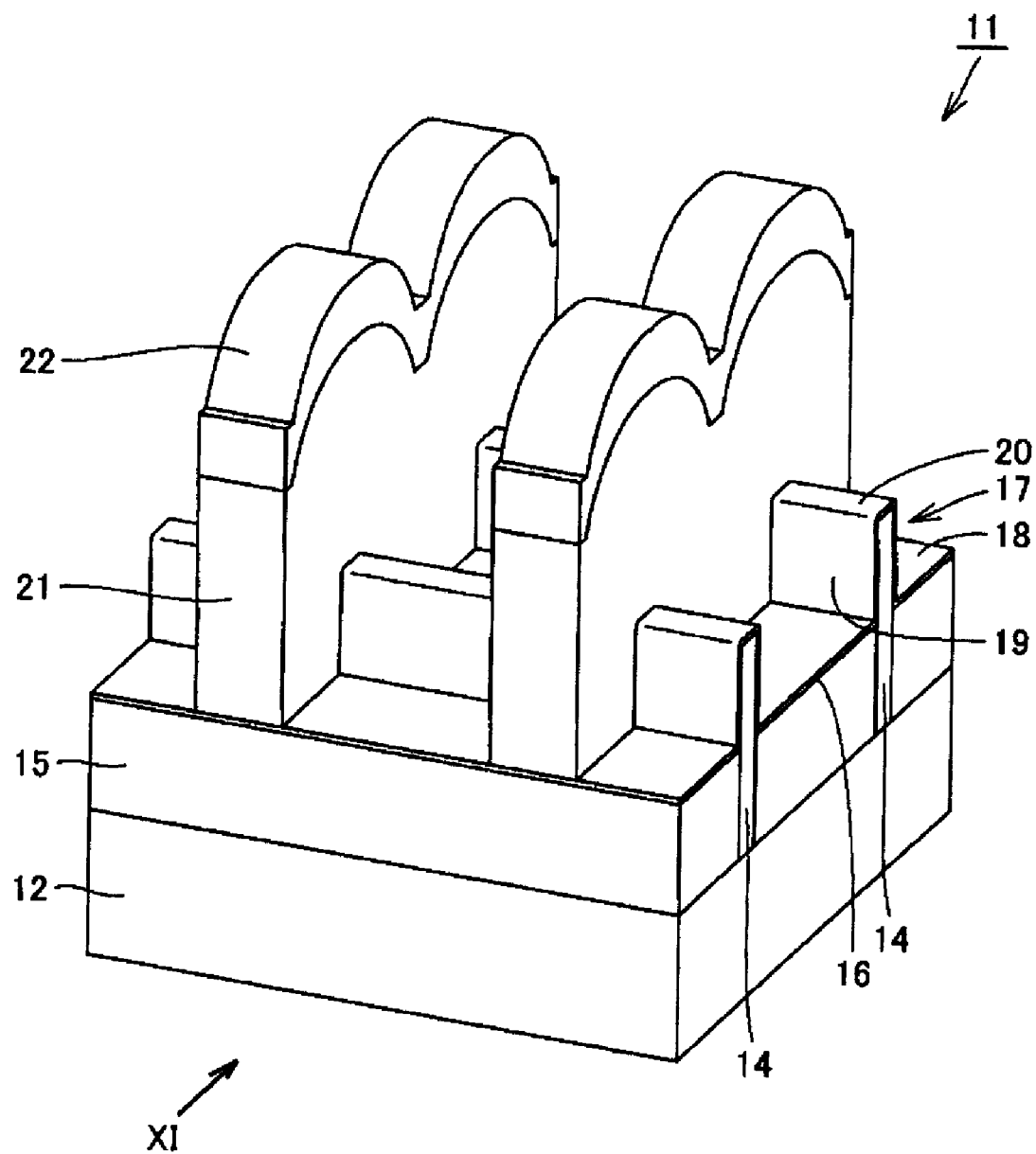
FIG. 4 is an exterior perspective view of the semiconductor device of FIG. 3, is viewed from a direction of an arrow IV of FIG. 3.

FIGS. 1 through 4 are exterior perspective views for explaining a semiconductor device 11 manufactured according to a semiconductor device manufacturing method of an embodiment of the present invention. FIG. 1 shows a conductive layer 21 before an etching process is performed, and FIG. 2 shows the semiconductor device 11 of FIG. 1, viewed from a direction of an arrow II of FIG. 1. FIG. 3 shows the conductive layer 21 after the etching process is performed, and FIG. 4 shows the semiconductor device 11 of FIG. 3, viewed from a direction of an arrow IV of FIG. 3. The semiconductor device 11 manufactured according to the method of the present embodiment may be a semiconductor device including a metal oxide semiconductor (MOS) transistor having a is 3-dimensional structure, and an apparatus for performing the etching process may be a microwave plasma processing apparatus.

Before forming of an insulation layer, a plurality of protrusions 14 formed of polysilicon and extending by protruding upward from a main surface 13 of a semiconductor substrate 12 are formed on the semiconductor substrate 12, as shown in FIGS. 1 and 2. A cross-section of each protrusion 14 nearly has a rectangular shape. Also, each protrusion 14 extends in a direction indicated by an arrow I of FIG. 1. As shown in FIG. 3, a source region and a drain region are formed along a length direction of each protrusion 14, wherein the conductive layer 21, to be described later, after the etching process is sandwiched therebetween.

Then, SiO$_2$ film which functions as the insulation layer 15 is formed to cover the semiconductor substrate 12, excluding the protrusions 14. Next, a thin SiO$_2$ film 16 (gate oxide film)

is additionally formed as an insulation layer to cover the insulation layer and the protrusions 14. Here, since the thin SiO$_2$ film 16, which is formed of an oxidized silicon, is formed to cover the protrusions 14, the SiO$_2$ film 16 has protruding portions 17 that vertically extends. In other words, the SiO$_2$ film 16 including the protruding portions 17 includes a surface 18 contacting the insulation layer 15, a rising surface 19 protruding upward from the surface 18 and corresponding to sides of the protruding portions 17, and a top surface 20 disposed on the top end of the rising surface 19 with a predetermined height from the surface 18. Also, a high vertical step H is formed between the surface 18 and the top surface 20.

Then, the conductive layer 21 of poly-silicon is formed to cover the SiO$_2$ film 16. Patterning is performed on a portion of the conductive layer 21 that is to be a gate electrode, by using SiN 22 as a mask. Then, as shown in FIGS. 3 and 4, the conductive layer 21 is removed through the etching process, while leaving the conductive layer 21 on a channel region disposed between the source region and the drain region. The remaining conductive layer 21 is a gate electrode. As such, a MOS transistor having a 3-dimensional structure is formed on the semiconductor substrate 12.

Here, the etching process is performed by using microwave plasma, wherein a microwave is used as a plasma source, while applying bias power of 70 mW/cm$^2$ or above on the semiconductor substrate 12, under a high pressure condition of 85 mTorr or above. Also, in this case, a mixed gas prepared by mixing Cl$_2$ gas, HBr gas, and Ar gas is used as an etching gas.

According to the method of manufacturing the semiconductor device 11, when a predetermined area of the conductive layer 21 formed on the insulation layer 15 including the protruding portions 17 having the rising surface 19 is removed by patterning through the etching process, the microwave plasma, wherein a microwave is used as a plasma source, is used while applying bias power of 70 mW/cm$^2$ or above to the semiconductor substrate 12 under a high pressure condition of 85 mTorr or above. Accordingly, the activation of a reaction product generated during the etching process is suppressed, and the etching process may be performed while maintaining a high etching selectivity. As such, the etching process may be performed while forming a shape accurately, i.e., while not forming an etching residue on the rising surface 19, and preventing damage to the SiO$_2$ film 16 as an insulation layer. In this case, specifically, the top surface 20 of the SiO$_2$ film 16 that is mostly exposed to the etching gas or the reaction product may be prevented from being damaged. Also, when the semiconductor device 11 having the protruding portion 17 is etched, the conductive layer 21 may be removed by performing an etching process including only one operation. Accordingly, the semiconductor device 11 may be appropriately and efficiently manufactured, since two times of etching processes as in the conventional example doesn't need to be performed.

Figure 5:
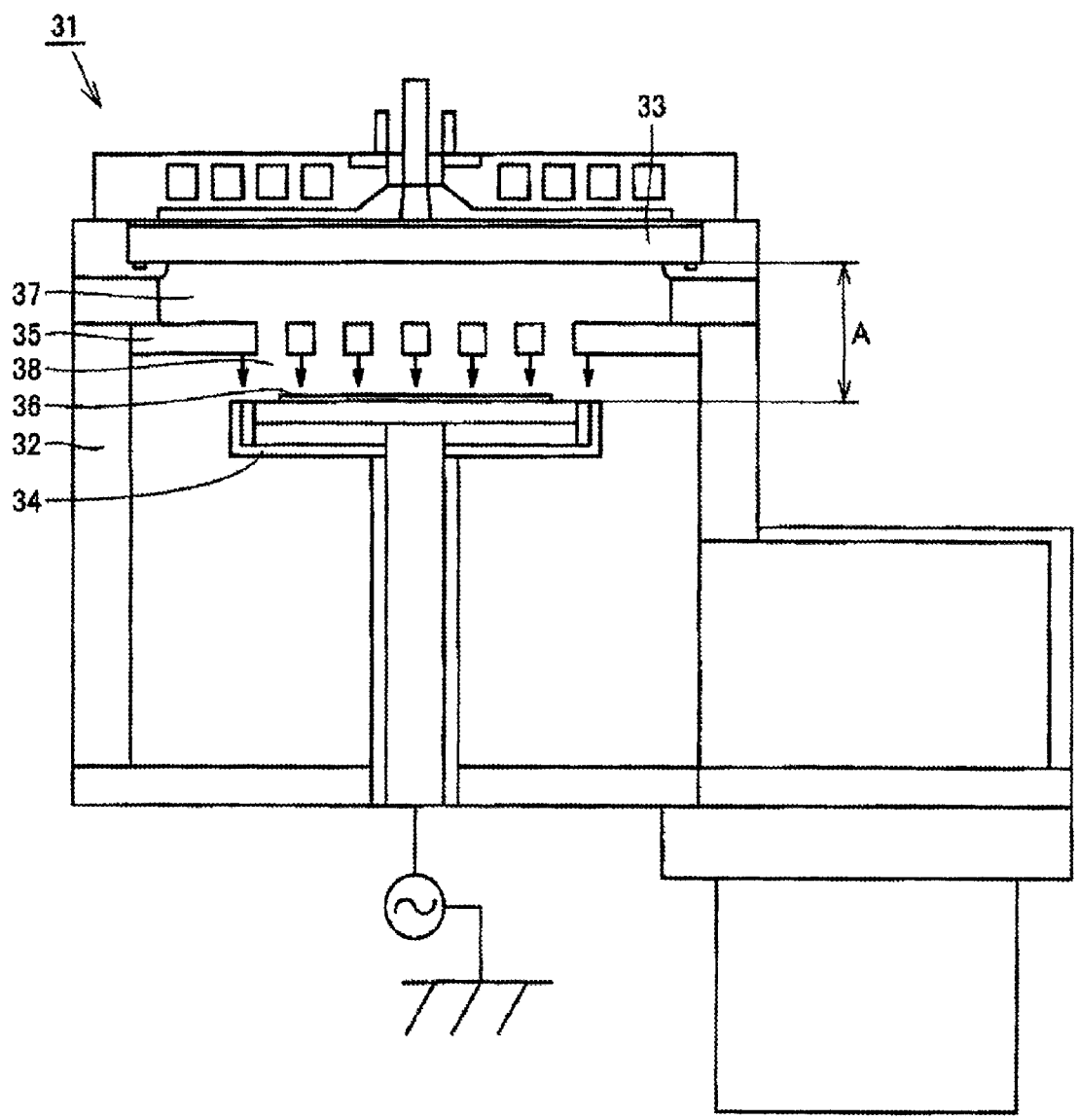
FIG. 5 is a schematic diagram of a plasma processing apparatus used in a semiconductor device manufacturing method, according to an embodiment of the present invention.

FIG. 5 is a schematic diagram of a plasma processing apparatus for processing by generating the plasma described above.

Referring to FIG. 5, the plasma processing apparatus 31 includes a sealable chamber 32 for processing the semiconductor substrate 36 accommodated in the plasma processing apparatus 31, and an antenna unit 33 for generating plasma in the chamber 32 according to microwaves fed from a waveguide.

A method of performing an etching process on the semiconductor substrate 36 with plasma by using the plasma processing apparatus 31 of FIG. 5 will now be simply described. First, the semiconductor substrate 36 to be processed is placed on a susceptor 34 inside the chamber 32. Next, the chamber 32 is depressurized until the pressure inside the chamber 32 satisfies a discharge condition of the microwave plasma described above, and a predetermined bias voltage is applied to the semiconductor substrate 36. Then, microwaves are generated by a high-frequency power supply source, and is fed to the antenna unit 33 through the waveguide. As such, plasma is generated in a plasma generating region 37 from the antenna unit 33. The generated plasma reaches a plasma diffusion region 38 through a gas shower head 35, and an etching process is performed as the plasma reacts in the plasma diffusion region 38 with a material gas supplied from the gas shower head 35.

The antenna unit 33 includes a slot plate of a disk shape having a plurality of slot holes that are each formed to have a T-shape when viewed from below, so as to emit the microwaves fed from the waveguide to the chamber 32 through the plurality of slot holes. As such, plasma having a uniform electron density distribution may be generated.

Also, since, in the plasma processing apparatus 31, bias power or a frequency of a bias voltage is arbitrarily changeable, the conditions of the bias voltage are easily changed.

According to an example of the structure of the plasma processing apparatus 31, a distance between the susceptor 34, on which the semiconductor substrate 36 is placed, and the antenna unit 33 may be about 120 mm, and a distance between the susceptor 34 and the gas shower head 35 may be about 40 mm. Also, as a discharge condition, a frequency is 2.45 GHz. According to the plasma processing apparatus 31 having the structure described above, when a downward distance from the antenna unit 33 to the susceptor 34 is A (mm), a range of $0 \leq A \leq 25$ is the plasma generating region 37. Also, a range of $50 \leq A \leq 120$ is the plasma diffusion region 38. Also, an electron temperature that will be described later is a temperature in the vicinity of the surface of the semiconductor substrate 36 in the plasma diffusinon region 38.

Figure 6:
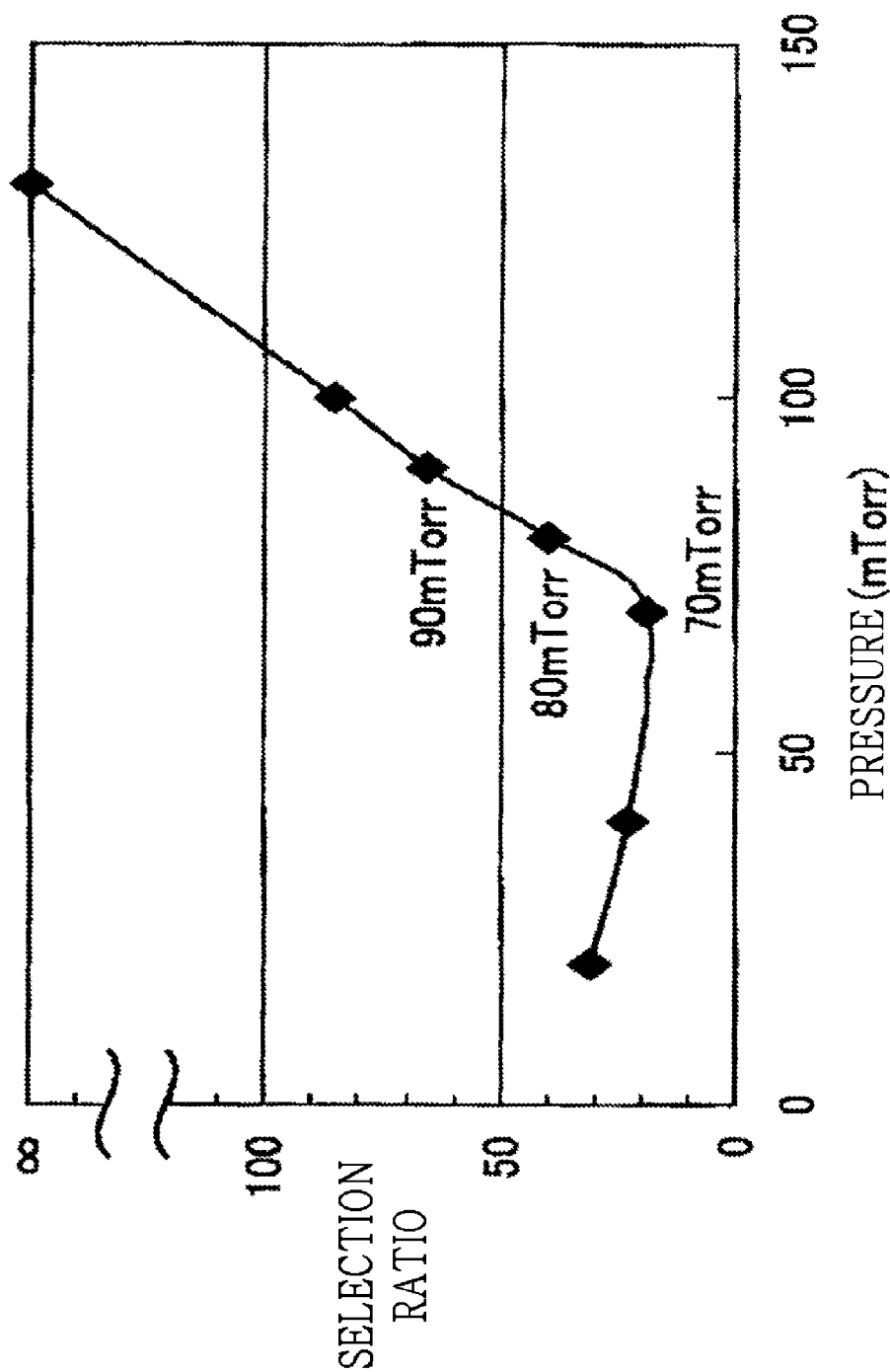
FIG. 6 is a graph showing a relationship between pressure and a etching selectivity.
Figure 13:
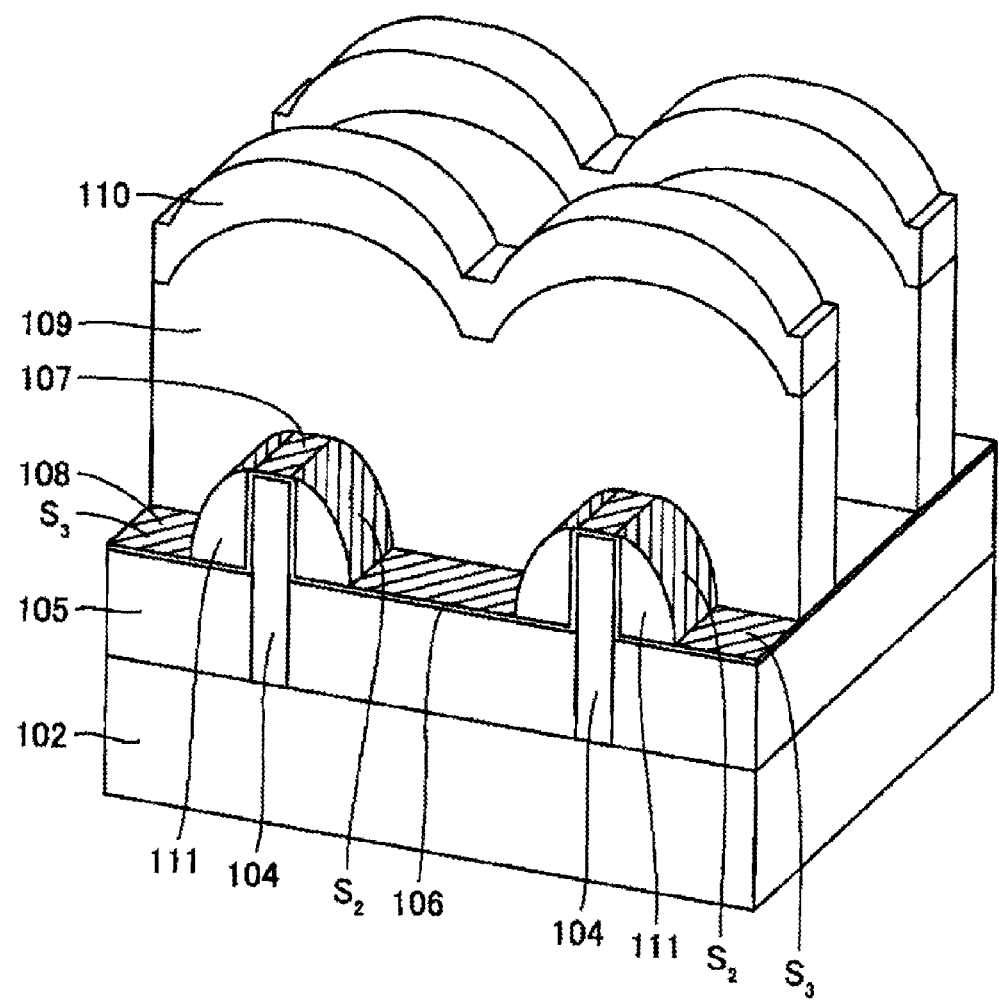
FIG. 13 is an exterior perspective view of the semiconductor device of FIG. 12, on which an etching residue remains.
Figure 14:
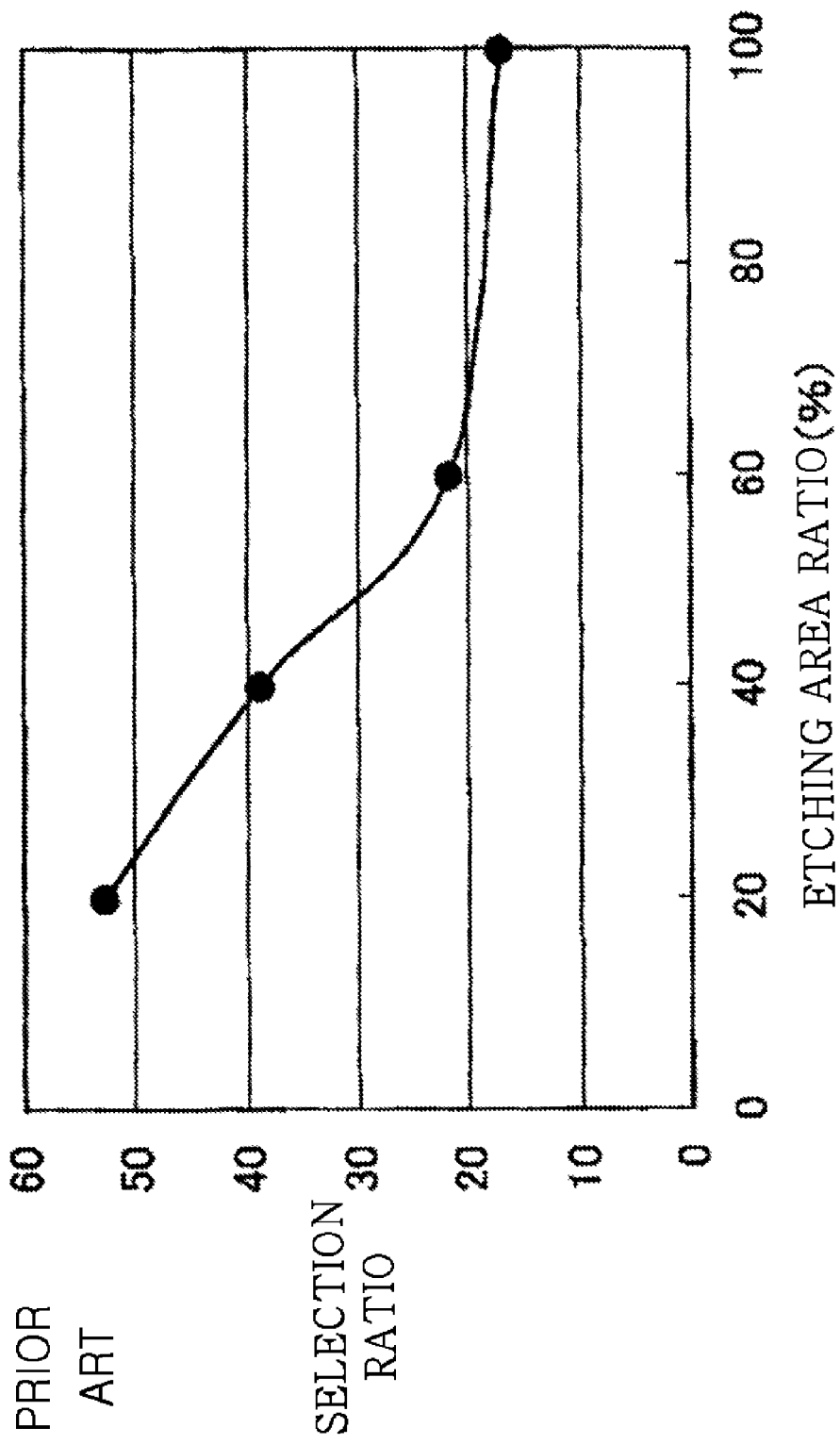
FIG. 14 is a graph showing a relationship between an etching area ratio and a etching selectivity.

FIG. 6 is a graph showing a relationship between pressure and a etching selectivity. In FIG. 6, the horizontal axis indicates pressure in mTorr, and the vertical axis indicates a etching selectivity(poly-silicon/SiO$_2$). Here, bias power applied to a semiconductor substrate is 70 mW/cm$^2$. Referring to FIG. 6, the etching selectivity is the lowest when the pressure is 70 mTorr, and the etching selectivity increases as the pressure increases to 80 mTorr and 90 mTorr. In this case, with respect to a relationship between S$_2$ and S$_3$ shown in FIG. 13, the pressure needs to be higher than at least 85 mTorr so that the etching selectivity is 50 or higher. Accordingly, during an etching process, if the pressure condition is a high pressure condition of 85 mTorr or above, the etching selectivity is 50 or above, thereby maintaining a high etching selectivity. As a result, a conductive layer formed of polysilicon may be removed through active etching. More preferably, when the pressure is 100 mTorr or higher, the etching selectivity of 50 or above is more definitely obtained.

Figure 7:
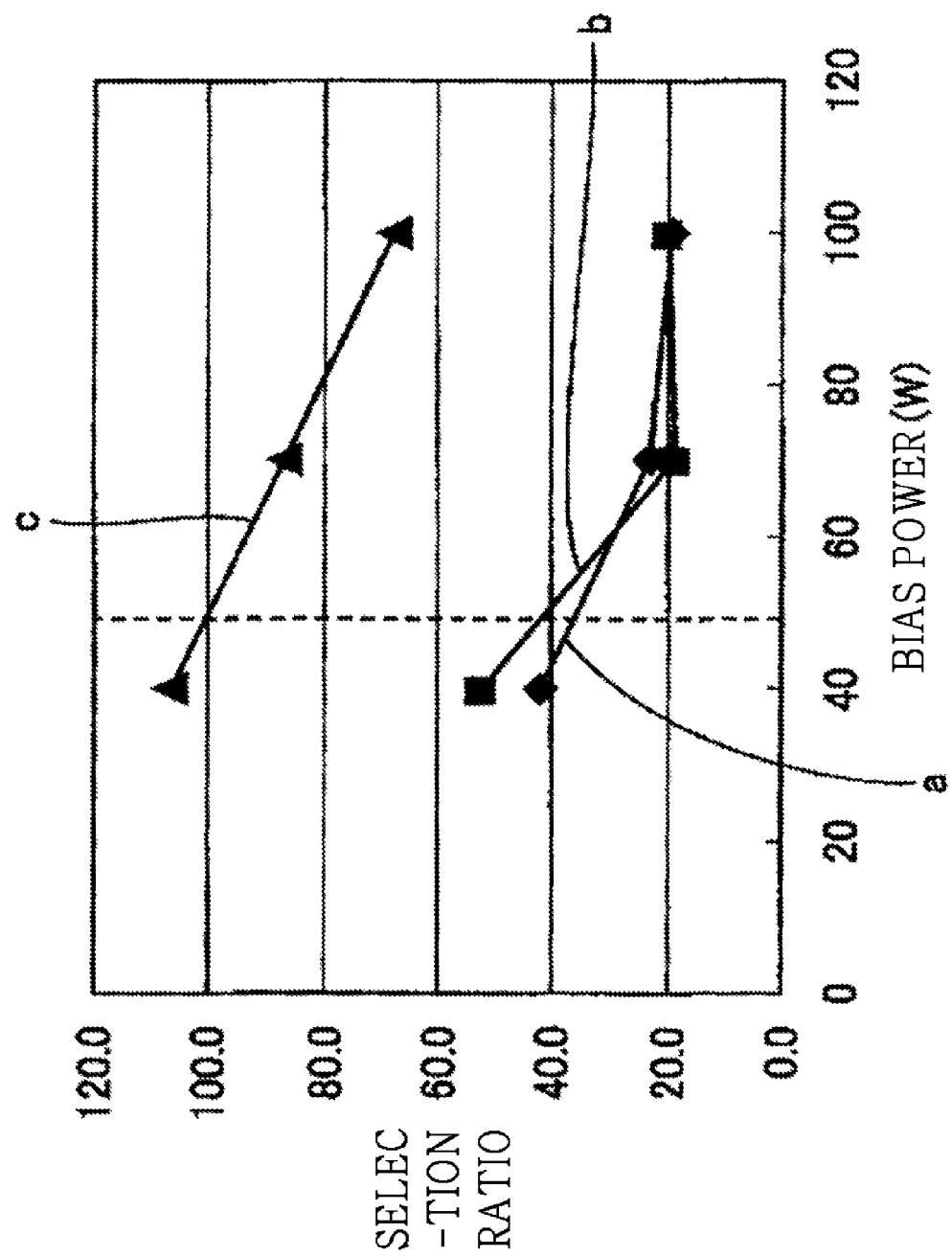
FIG. 7 is a graph showing a relationship between bias power and a etching selectivity.

FIG. 7 is a graph showing a relationship between bias power and a etching is selectivity. In FIG. 7, the horizontal axis indicates bias power (W), and the vertical axis indicates a etching selectivity. A semiconductor substrate of φ300 mm will be used. In FIG. 7, 'a' denotes a result when the pressure is 40 mTorr, 'b' denotes a result when the pressure is 70 mTorr, and 'c' denotes a result when the pressure is 100 mTorr. Referring to FIG. 7, in each pressure, when bias power is reduced, a etching selectivity is increased. However, when the bias power is 50 W or lower, i.e., 70 mW/cm$^2$ or lower, it is difficult to control a shape, and thus a side etching shape may occur as sides are etched. Accordingly, by maintaining the bias power 50 W or above, i.e., 70 mW/cm$^2$ or above, the side etching shape may be avoided. Here, the etching selectivity of 60 or above may be obtained even when the bias power is 100 W.

Meanwhile, when the frequency of the bias voltage is too high, plasma is generated on the semiconductor substrate. On the other hand, when the frequency of the bias voltage is too low, the efficiency of the bias power decreases. Accordingly, by maintaining the frequency of the bias voltage to be from 100 kHz to 2 MHz, such a problem may be avoided while decreasing the re-dissociation of a reaction product generated during the etching process, and thus a high etching selectivity may be maintained.

As described above, the plasma is generated on the semiconductor substrate when the frequency of the bias voltage is higher than 2 MHz, but when a higher frequency of, for example from 10 MHz to 15 HMz, specifically, 13.56 MHz, is used, the dragging of ions to the semiconductor substrate is suppressed according to the high frequency, compared to the frequency of 2 MHz, and thus damage to the semiconductor substrate is reduced. Accordingly, this range of frequency of the bias voltage may be used.

Figure 8:
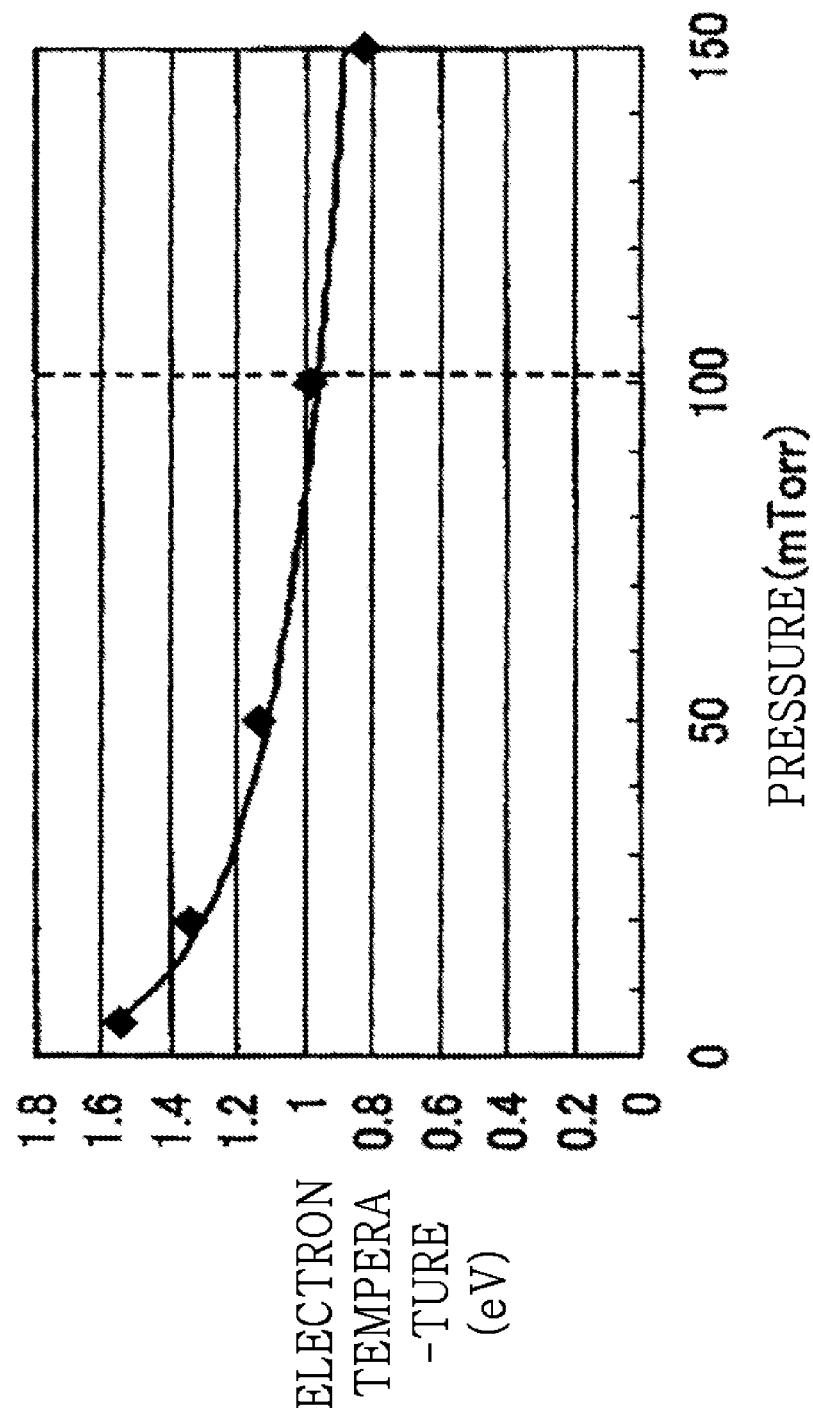
FIG. 8 is a graph showing a relationship between pressure and an electron temperature.

FIG. 8 is a graph showing a relationship between pressure and an electron temperature in the plasma processing apparatus shown in FIG. 5. In FIG. 8, the horizontal axis indicates pressure in mTorr, and the vertical axis indicates an electron temperature in eV. In this plasma processing apparatus, the electron temperature may be 1.0 eV or lower by maintaining the pressure to be 85 mTorr or above. More definitely, the electron temperature may be 1.0 eV or lower by maintaining the pressure to be 100 mTorr or above.

Figure 9:
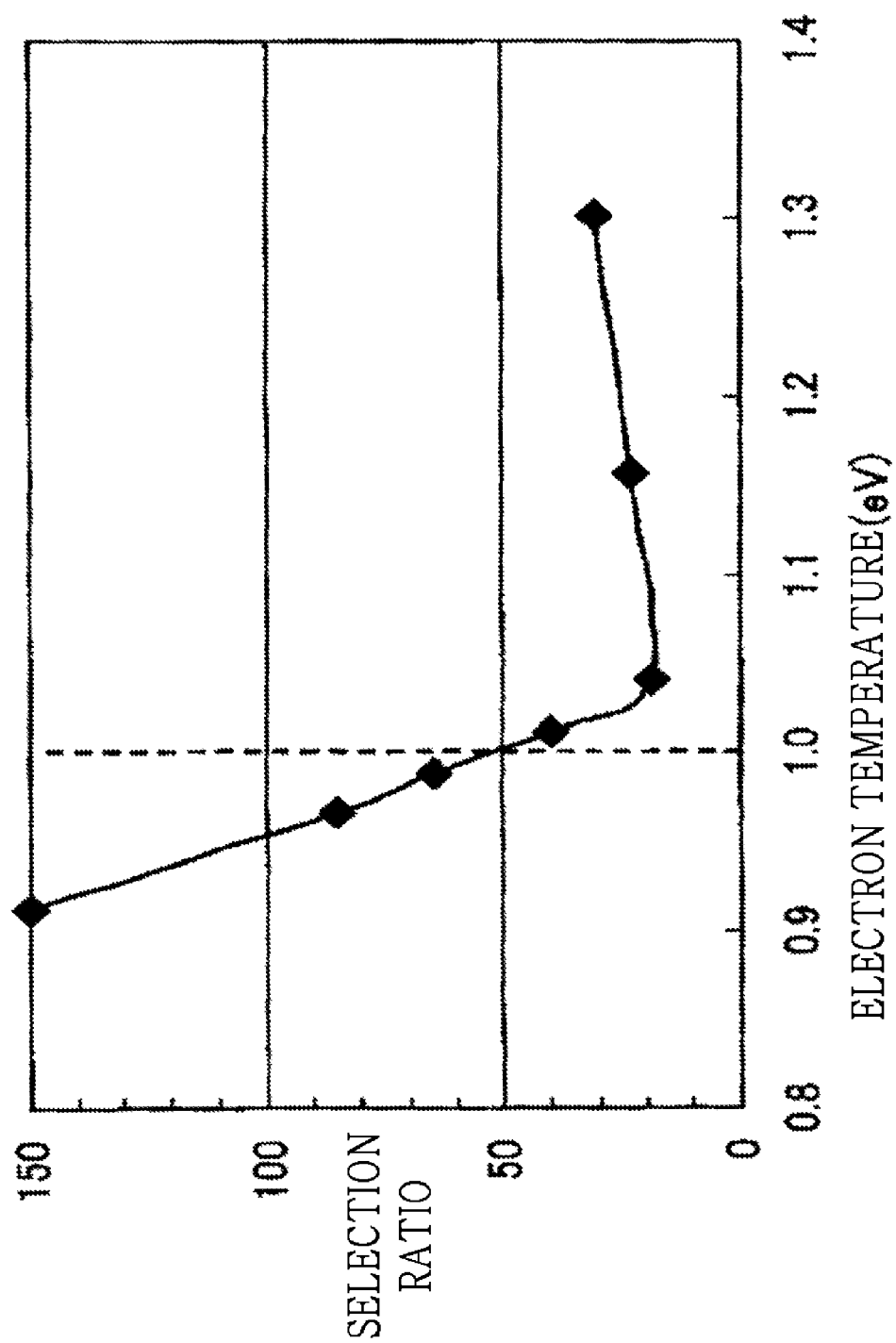
FIG. 9 is a graph showing a relationship between an electron temperature and a etching selectivity.

FIG. 9 is a graph showing a relationship between an electron temperature and a etching selectivity. In FIG. 9, the horizontal axis indicates an electron temperature in eV, and the vertical axis indicates a etching selectivity. Referring to FIG. 9, in order to maintain the etching selectivity to be 50 or above, the electron temperature needs to be 1.0 eV or lower. Accordingly, an etching process may be performed while maintaining a high etching selectivity, by setting the electron temperature to be 1.0 eV or lower. As such, the etching process may be performed while forming a shape accurately, i.e., while not generating an etching residue at the side of the rising surface 19, and preventing a damage to the $SiO_2$ film 16 which functions as an insulation layer. Here, damage to the $SiO_2$ film 16, specifically, to the top surface 20 that is mostly exposed to an etching gas or a reaction product, is prevented. Also, when the semiconductor device 11 having the protruding portions 17 is etched, the conductive layer 21 may be removed by an etching process of only one operation. Accordingly, the semiconductor device 11 may be appropriately and efficiently manufactured, since two times of etching processes as in the conventional example doesn't need to be performed. Also here, the electron temperature may have an error, which may be 1.05 eV or lower.

Figure 10:
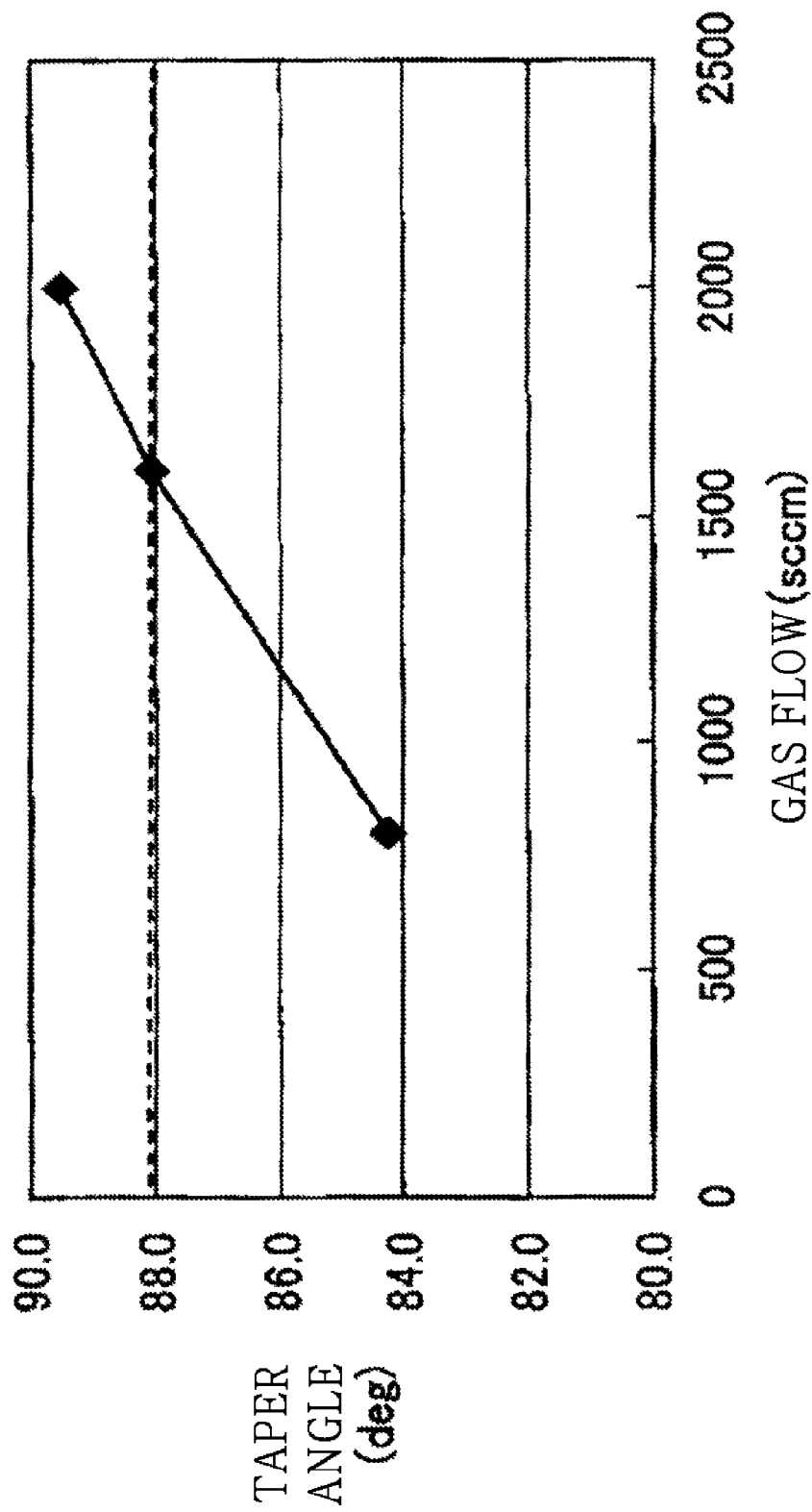
FIG. 10 is a graph showing a relationship between a gas flow and a taper angle.
Figure 11:
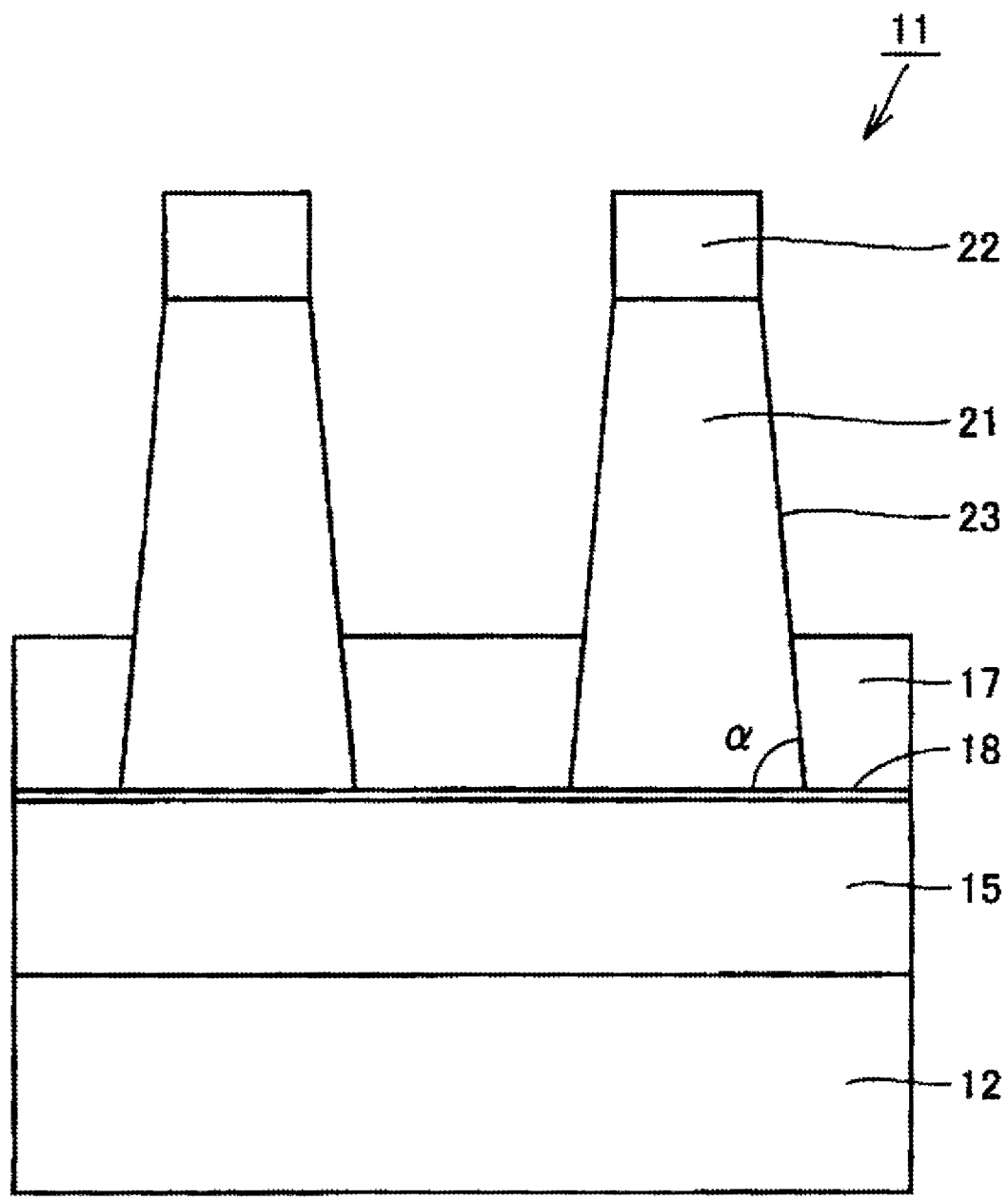
FIG. 11 is a diagram of the semiconductor device of FIG. 4, viewed from a direction of an arrow XI of FIG. 4.
Figure 12:
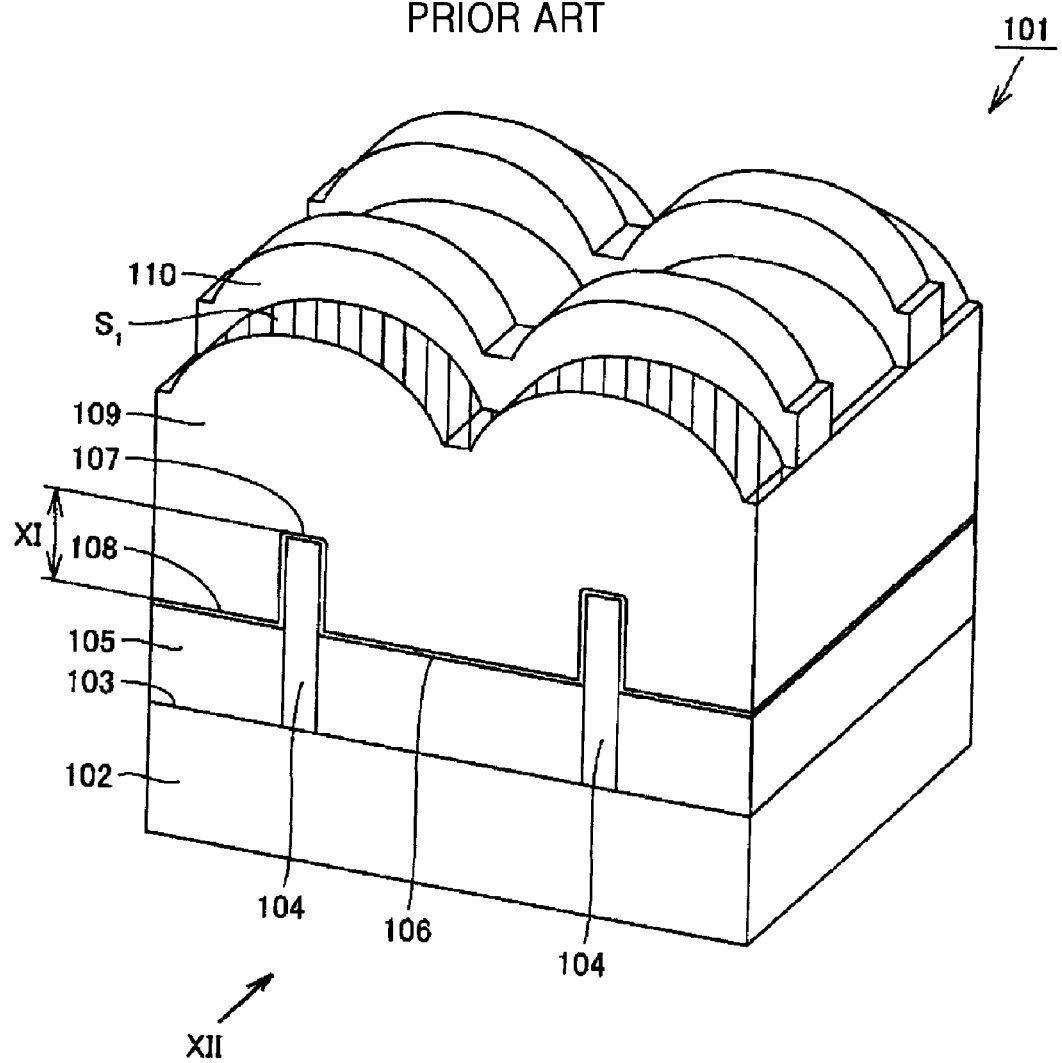
FIG. 12 is an exterior perspective view of a semiconductor device including a metal oxide semiconductor (MOS) transistor having a 3-dimensional structure.

Also, preferably, a flow of an etching gas during the etching process is 1600 sccm or above. FIG. 10 is a graph showing a relationship between a flow of an etching gas and a taper angle. In FIG. 10, the horizontal axis indicates a gas flow in sccm, and the vertical axis indicates a taper angle in degrees. Here, the taper angle denotes an angle α formed between a sidewall 23 of the conductive layer 21 and the surface 18 shown in FIG. 11. FIG. 11 is a diagram of the semiconductor device 11 of FIG. 4, viewed from a direction of an arrow XI of FIG. 4. Referring to FIGS. 10 and 11, as the gas flow increases, the taper angle increases to 90°. In other words, the sidewall 23 of the conductive layer 21 protrudes upward from the surface 18, and becomes perpendicular to the surface 18. Here, by setting the gas flow to be 1600 sccm or above, the taper angle is closer to 90° than 88°. Also, preferably, the gas flow is 2200 sccm or lower based on the capacity of a general turbo pump used in the plasma processing apparatus.

Also, according to the above embodiments, a semiconductor device manufacturing method of an embodiment of the present invention, includes forming an insulation layer having the protruding portions 17 formed to cover the protrusions 14 having a cross-section that is roughly a rectangular shape, but the present invention is not limited thereto. For example, the method may include forming an insulation layer having protruding portions, the insulating layer having a surface and a rising surface that protrudes upward from the surface, wherein a cross-section of each of the insulation layer has a stepped shape. This is because a high etching selectivity is required during an etching process, since an etching residue may remain between the surface and the rising surface in the protruding portions.

Also in the above embodiments, the above-described etching process of the present invention is applied to a gate etching process when a conductive layer is formed of poly-silicon and a gate electrode is formed; however the present invention is not limited thereto, and the etching process of the present invention may also be applied to a gate etching process when a conductive layer is formed of a metal layer. Examples of the metal include titanium (Ti), tantalum (Ta), and tungsten (W).

Also, in the above embodiments, an oxidized silicon ($SiO_2$) is used as an insulation layer; however the present invention is not limited thereto, and an oxidized layer including hafnium (Hf), zirconium (Zr), or aluminum (Al) may be used as an insulation layer.

Also, in the above embodiments, a MOS transistor having a 3-dimensional structure is used as a semiconductor element; however the present invention is not limited thereto, and a semiconductor device having a 3-dimensional structure may include a semiconductor element, such as a charge-coupled device (CCD).

While this invention has been particularly shown and described with reference to exemplary embodiments thereof, it will be understood by those of ordinary skill in the art that various changes in form and details may be made therein without departing from the spirit and scope of the invention as defined by the appended claims.

Industrial Applicability

A semiconductor device manufacturing method according to the present invention is effectively used when the semiconductor device needs to be appropriately and efficiently manufactured.

The invention claimed is:

1. A semiconductor device manufacturing method, the method comprising:
    forming an insulation layer over a semiconductor substrate, the insulation layer having a surface and a raised portion rising upward from the surface;
    forming a first conductive layer to cover the insulation layer having the raised portion; and
    removing a predetermined region of the first conductive layer by patterning the predetermined region according to an etching process whose etching selectivity of the first conductive layer to the insulation layer is 50 or higher, wherein the etching process is performed by microwave plasma using a microwave as a plasma source, while applying bias power equal to or more than 70 mW/cm$^2$ and equal to or less than 140 mW/cm$^2$ to the semiconductor substrate, under a high pressure condition of 85 mTorr or above.

2. The method of claim 1, wherein a bias voltage of a frequency from 100 kHz to 2 MHz is applied to the semiconductor substrate, while performing the etching process.

3. The method of claim 1, wherein a flow of an etching gas is 1600 sccm or above while performing the etching process.

4. The method of claim 1, wherein the insulation layer is an oxidized silicon film, and the first conductive layer is a polysilicon layer.

5. The method of claim 1, further comprising:
before the forming of the insulation layer, forming a second conductive layer having a protrusion that protrudes upward on the semiconductor substrate,
wherein the insulation layer comprises a thin insulation layer, the raised portion of the insulation layer conforming to the protrusion of the second conductive layer.

6. The method of claim 1, wherein the raised portion has a predetermined height from the surface.

7. A semiconductor device manufacturing method, the method comprising:
forming a protrusion on a semiconductor substrate, the protrusion protruding upward from a main surface of the semiconductor substrate and constituting a source region, a drain region and a channel region of the semiconductor device;
forming an insulation layer covering the protrusion, the insulation layer constituting a gate insulation film on the channel region disposed between the source region and the drain region of the semiconductor device;
forming a conductive layer covering the insulation layer; and
forming a gate electrode by removing the conductive layer while leaving a portion of the conductive layer on the channel region, by patterning the conductive layer according to an etching process whose etching selectivity of the conductive layer to the insulation layer is 50 or higher, wherein the etching process is performed by microwave plasma using a microwave as a plasma source, while applying bias power equal to or more than 70 mW/cm$^2$ and equal to or less than 140 mW/cm$^2$ to the semiconductor substrate, under a high pressure condition of 85 mTorr or above.

* * * * *